United States Patent [19]
Kamei et al.

[11] Patent Number: 5,412,482
[45] Date of Patent: * May 2, 1995

[54] SIGNAL LINE CHANGEOVER CIRCUIT WITH EMITTER FOLLOWERS

[75] Inventors: Shinji Kamei, Kyoto; Yasunori Kawamura, Funai, both of Japan

[73] Assignee: Rohm Co., Ltd., Kyoto, Japan

[ * ] Notice: The portion of the term of this patent subsequent to Dec. 27, 2011 has been disclaimed.

[21] Appl. No.: 841,164

[22] Filed: Feb. 25, 1992

[30] Foreign Application Priority Data

Feb. 26, 1991 [JP] Japan .................. 3-056029

[51] Int. Cl.⁶ .............. H04N 5/782; H04N 5/262
[52] U.S. Cl. ................... 358/335; 358/310; 358/316; 358/314; 348/705
[58] Field of Search ............ 358/310, 326, 19, 20, 358/317, 335, 316, 314, 315; H04N 5/782; 455/343; 360/4, 58, 33.1; 348/571, 607, 705, 730

[56] References Cited

U.S. PATENT DOCUMENTS 4,782,246  11/1988  Kuroyanagi et al. ............ 358/19
5,038,203   8/1991  Hagino et al. ................. 358/19

FOREIGN PATENT DOCUMENTS 0208769  9/1987  Japan ............ H04N 5/782
0092183  4/1988  Japan ............ H04N 5/783

*Primary Examiner*—Tommy Chin
*Assistant Examiner*—Huy Nguyen
*Attorney, Agent, or Firm*—Nikaido, Marmelstein, Murray & Oram

[57] ABSTRACT

A signal line changeover circuit includes a first signal processing block having a first emitter follower for outputting a signal, a second signal processing block having a second emitter follower for outputting a signal, and a switch block having a first terminal connected to an output terminal of the first emitter follower through a first signal line, a second terminal connected to an output terminal of the second emitter follower through a second signal line, a third terminal for outputting a signal, a selection switch for alternatively connecting the first and second terminals to the third terminal, a first switch connected between the first terminal and a power line and turned on when the selection switch selects the second terminal and a second switch connected between the second terminal and the power line and turned on when the selection switch selects the first terminal.

5 Claims, 4 Drawing Sheets

SIGNAL LINE CHANGEOVER CIRCUIT WITH EMITTER FOLLOWERS

BACKGROUND OF THE INVENTION

1. Field of the Invention

The present invention relates to signal line changeover circuits, and more particularly, to signal line changeover circuits for use in integrated circuits.

2. Description of the Prior Art

For example, among color signal processing circuits of a video cassette recorder (VCR) consisting of the integrated circuit (IC), an automatic color control (ACC) circuit has, as shown in FIG. 1, a portion common to both a recording system and a playback system. When a signal is inputted to the common portion, a changeover of the input signal is performed by a selection switch (recording/playback changeover switch).

In the Fig. 1, solid lines show the recording system, while alternate long and short dash lines show the playback system. Blocks 3, 6, and 8 are common to the recording and playback systems. In the recording system, a color signal inputted into an input terminal 1 passes through a band pass filter 2 with a center frequency of 3.58 MHz, and thereafter, is provided to a gain variable amplifier 3 for ACC. An output of the gain variable amplifier 3 is decreased in frequency to 629 kHz by a balanced modulation circuit 4, and thereafter, is directed to an output terminal 60 by way of a low pass filter 5. The output of the gain variable amplifier 3 is also provided to a color burst level detection circuit 8 through a selection switch 7 in the switch block 6. An output of the color burst level detection circuit 8 is supplied to the gain variable amplifier 3 so as to control a gain of the gain variable amplifier 3.

In the playback system, a playback color signal inputted into an input terminal 9 passes through a band pass filter 10 with a center frequency of 629 kHz, and thereafter, is provided to the gain variable amplifier 3. In this case, an output of the gain variable amplifier 3 is converted into a signal which has a carrier of 3.58 MHz by the succeeding balanced modulation circuit 4. Then, after passing through the band pass filter 2 of 3.58 MHz and a comb filter 11, it is amplified by an amplifier 12, and thereafter, is directed to an output terminal 13. The color signal directed to the output terminal 13 is further directed to a Y/C mixer (not shown) connected to the output terminal 13 to be combined with a luminance signal.

In FIG. 1, the selection switch 7 in the switch block 6 is set to a contact R side during a recording operation so that the output of the gain variable amplifier 3 is directed to the detection circuit 8. During a playback operation, the switch 7 is set to a contact P side so that an output of the amplifier 12 is directed to the detection circuit 8.

FIG. 2 shows a main portion of the circuit shown in FIG. 1, with which a problem will be described. In FIG. 2, during a recording operation when the selection switch 7 is set to the contact R, a color signal from the gain variable amplifier 3 is supplied to the color burst level detection circuit 8 through the switch 7, while the output of the amplifier 12 is blocked by the switch 7 and is not coupled to the detection circuit 8. Moreover, during a playback operation when the selection switch 7 is set to the contact R, a color signal from the amplifier 12 is supplied to the detection circuit 8 through the switch 7, while the output of the gain variable amplifier 3 is blocked by the switch 7 and is not coupled to the detection circuit 8.

Since an output signal line 14 of the gain variable amplifier 3 and an output signal line 15 of the amplifier 12 run long to the switch block 6 in the IC, there arises problems that an un-used output signal line influences the other signal line and that it influences an adjoining third circuit on the way to the switch block 6. The problems are conspicuous particularly with respect to a circuit where signal lines are densely arranged such as a large scale integrated circuit.

To solve the above-described problems, a method may be used where a switch is provided to each signal block (in FIG. 2, the gain variable amplifier 3 and the amplifier 12) in order that no signal is outputted to an output signal line when the signal of the block is unnecessary. In that case, however, not only the size of each block (3, 12) should be increased but also another control line should be provided for controlling the switch provided to each block, whereby the structure of the IC becomes more complicated because of the increased number of lines as well as a degree of integration decreases.

SUMMARY OF THE INVENTION

An object of the present invention is to realize a signal line changeover circuit with a simple arrangement where a signal line which is not selected by a selection switch does not influence circuits adjacent thereto.

To achieve the above-mentioned object, signal line changeover circuit according to the present invention is provided with: a first circuit including an emitter follower for outputting signal; a first signal line connected to an output terminal of the emitter follower of said first circuit; a second circuit including an emitter follower for outputting a signal; a second signal line connected to an output terminal of the emitter follower of said second circuit; a common circuit which operates similarly in response to a signal from said first circuit and in response to a signal from said second circuit; and a switch block including a selection switch for selecting one of said first and second signal lines to provide an output signal of said first or second circuit to said common circuit and a switch for providing a voltage for causing an unselected signal line to disable the emitter follower connected thereto through said unselected signal line.

According to the above-described feature, since no signal is provided to a signal line which has not been selected by the selection switch between a signal block thereof and a switch block, the other signal line and other circuits are not influenced. Furthermore, although an emitter follower which is disabled in order that no signal is outputted to the unselected signal line exists in the signal block, there is no need to increase the number of lines since the unselected signal line is used for the disabling control.

BRIEF DESCRIPTION OF THE DRAWINGS

This and other objects and features of this invention will become clear from the following description taken in conjunction with the preferred embodiments with reference to the accompanied drawings in which.

DESCRIPTION OF THE PREFERRED EMBODIMENT

Figure 2:
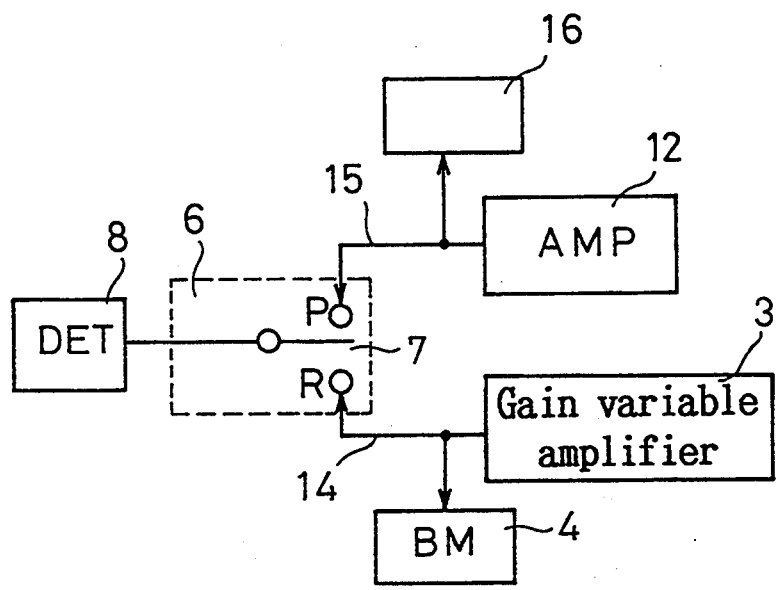
FIG. 2 is a block diagram plainly showing a main portion of FIG. 1.
Figure 3:
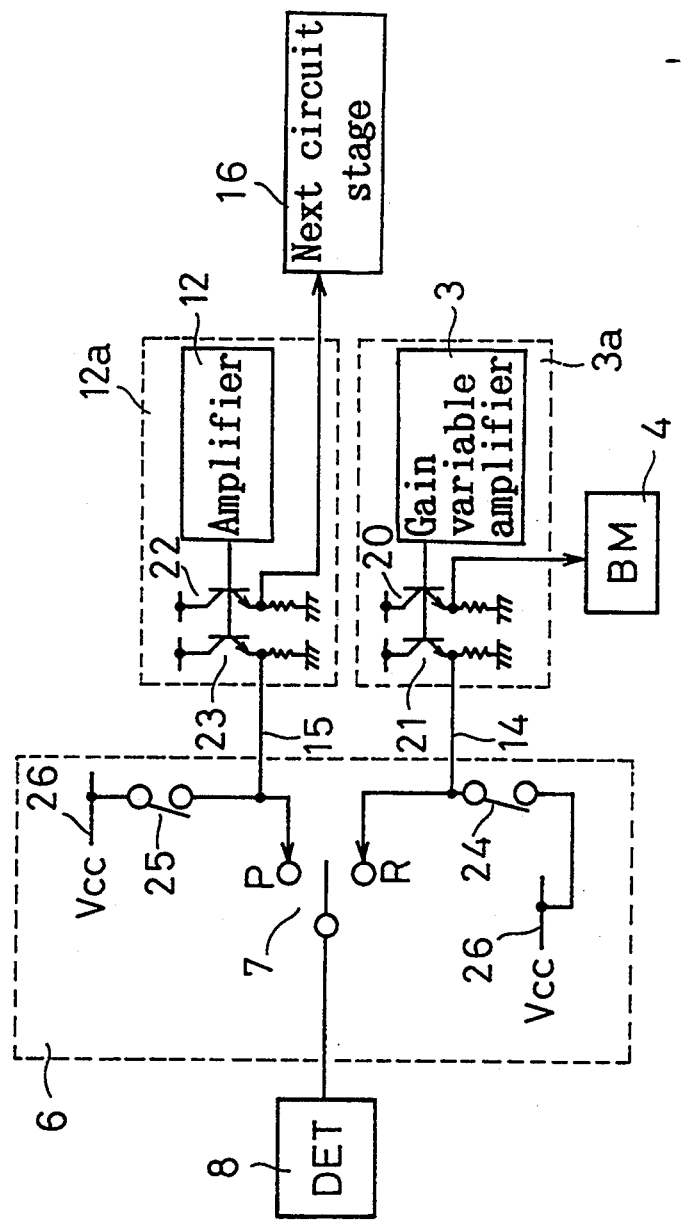
FIG. 3 is a block diagram of a main portion of a color signal processing circuit for VCRs employing a signal changeover circuit of the present invention.

In FIG. 3 showing an embodiment of the present invention, portions the same as those of the prior art shown in FIG. 2 are represented by the same reference designations. In this embodiment, emitter followers 20 and 21 are provided on the output side of a signal block 3a including a gain variable amplifier 3. Similarly, emitter followers 22 and 23 are provided on the output side of a signal block 12a including an amplifier 12 as shown in the figure.

The emitter follower 20 of the block 3a provides an output of the gain variable amplifier 3 to a balanced modulation circuit 4. The emitter follower 21 provides an output of the gain variable amplifier 3 to a contact R of a selection switch 7 in a switch block 6.

Figure 1:
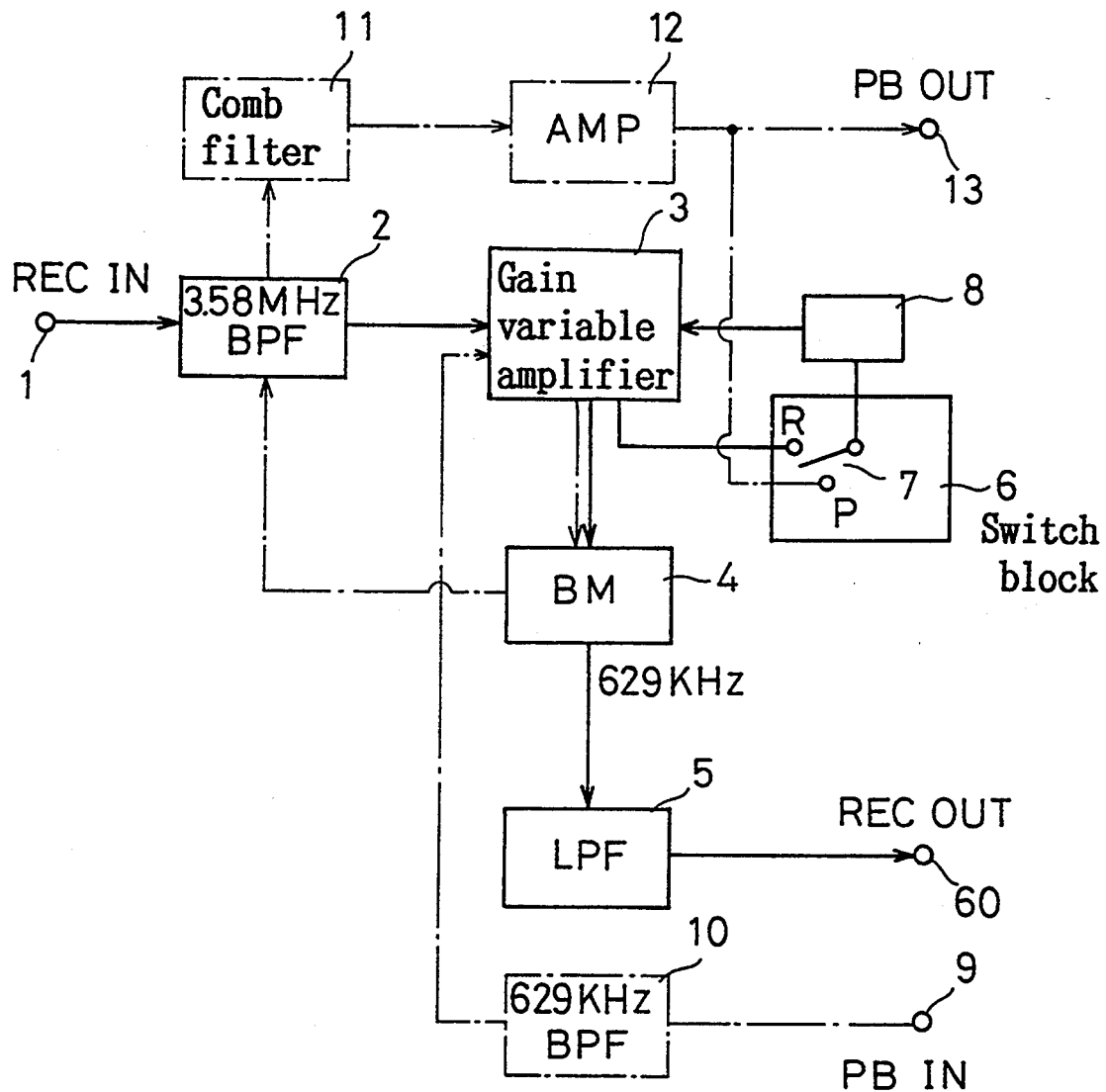
FIG. 1 is a block diagram of a color signal processing circuit for VCRs employing a conventional signal changeover circuit.

On the other hand, the emitter follower 22 in the block 12a provides a color signal amplified by the amplifier 12 to an output terminal shown in FIG. 1 and a Y/C mixer, etc. (in FIG. 3, arranged in a block 16 on the next stage) connected thereto. Moreover, the emitter follower 23 provides the color signal amplified by the amplifier 12 to a contact P of the selection switch 7 in the switch block 6.

Signal lines 14 and 15 connected between the emitter followers 21 and and the contacts R and P of the selection switch 7, respectively, are coupled to a power line 26 at the switch block 6 through switches 24 and 25. The switches 24 and 25 as well as the selection switch 7 are controlled by a switch control circuit (not shown) provided in the switch is block 6. The control performed in synchronism with the above-described control of the selection switch 7.

During a recording operation, the selection switch 7 is set to the contact R so that the output of the gain variable amplifier 3 is directed to the detection circuit 8. When that happens, although the switch 24 is OFF, since the switch 25 is ON, a voltage Vcc of the power line 26 is applied to an emitter of the emitter follower 23 in the block 12a through the switch 25 and the signal line 15. Thereby, the emitter follower 23 is disabled, so that the amplifier 12 outputs no signal to the signal line 15. When that happens, the emitter follower 22 can be activated without being influenced by an operation of the switch 25. During a playback operation, the switch 25 is OFF and the selection switch 7 is set to the contact P, so that the output of the amplifier 12 is supplied via the signal line 15 to the detection circuit 8 through the switch 7. When that happens, the switch 24 is ON so that the voltage Vcc of the power line 26 is applied to an emitter of the emitter follower 21 in the block 3a. Thereby, the emitter follower 21 is disabled, so that no signal is outputted to the signal line 14 by the gain variable amplifier 3. The emitter follower 20 remains ON since it is not influenced by the switch 24, and provides the output of the gain variable amplifier 3 to the balanced modulation circuit 4. As described above, according to this embodiment, since when a signal is selectively supplied to the detection circuit 8 common to the two signal blocks 3a and 12a, no signal is provided from the signal blocks to a signal line which has not been selected by the selection switch 7, the unselected signal line does not influence the other signal line and other circuits.

Figure 4:
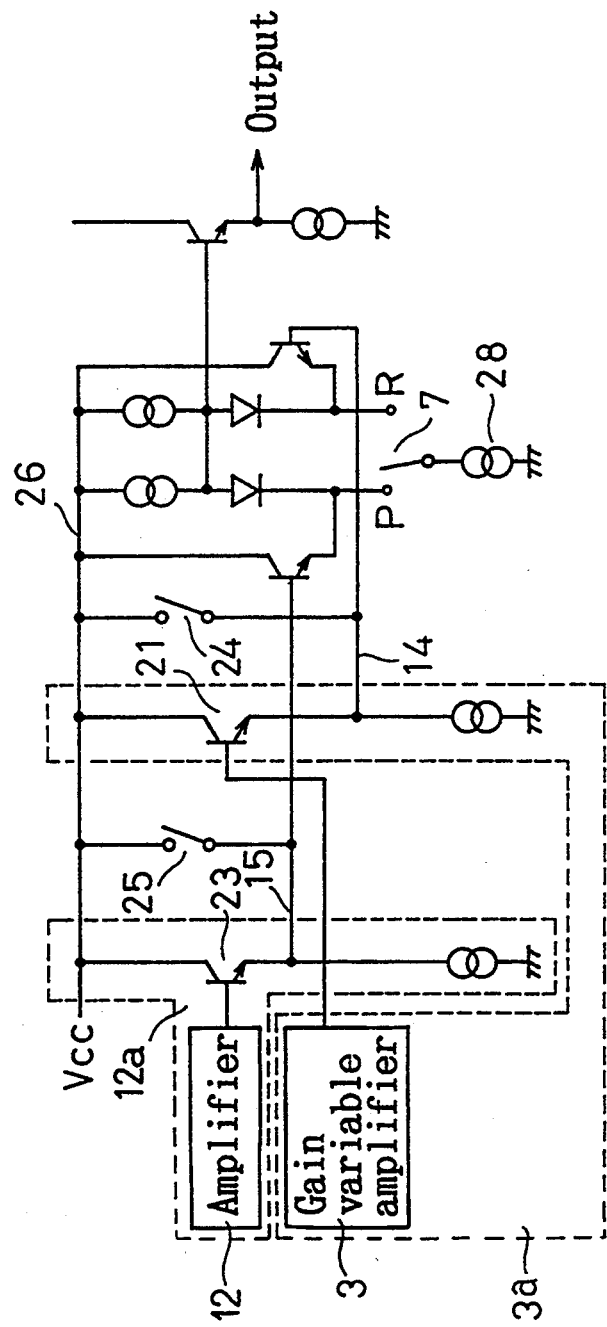
FIG. 4 is a circuit diagram showing a part of FIG. 3.

In the above-discussed embodiment, NPN-type transistors are used for the emitter followers. When PNP-type transistors are used, the circuit may be designed so that electric potential of a contact is provided to an emitter of an emitter follower by the switches 24 and 25. FIG. 4 shows a case where a main portion of the circuit shown in FIG. 3 is constituted by IC. In the figure, a constant current source 28 is provided between the selection switch 7 and the ground. The selection switch 7 connects the constant current source 28 to the contact P or R. Practically, the selection switch 7 and switches 24 and 25 are constituted by devices such as transistors.

According the present invention, as described above, since no signal is provided to a signal line which has not been selected by a selection switch from a signal block including the line, the other signal line and other circuits are not influenced. Furthermore, although an emitter follower which is disabled in order that no signal is outputted to the unselected signal line exists in the signal block, there is no need to increase the number of lines since the unselected signal line is used for the disabling control. Thus, an effect is obtained that an entire circuit does not become complicated in structure and large in size.

While a case where two signal lines are changed-over has been described in the above embodiment, a signal changeover circuit of similar arrangement as that of the above embodiment may be employed for a case where three signal lines are changed-over.

Obviously, many modifications and variations of the present invention are possible in light of the above teachings. It is therefore to be understood that within the scope of the appended claims, the invention may be practiced other than as specifically described.

What is claimed is:

1. A signal line changeover circuit for a video playback/recording device having a recording system and a playback system, said circuit comprising:
   a first signal processing circuit for processing a playback signal applied thereto, said first signal processing circuit including a first emitter follower for outputting a first signal therefrom;
   a second signal processing circuit for processing a recording signal applied thereto, said second signal processing circuit including a second emitter follower for outputting a second signal therefrom;
   a changeover switch including a first terminal connected to an emitter of said first emitter follower through a first signal line, a second terminal connected to an emitter of said second emitter follower through a second signal line and a third terminal connected to a third signal processing circuit, said changeover switch connecting said first and third terminals during a playback operation and connecting the second and third terminals during a recording operation;
   a first switch connected between said first terminal and a power line and switched to connect said first terminal and said power line during the recording operation; and
   a second switch connected between said second terminal and said power line and switched to connect said second terminal and said power line during the playback operation, wherein said first switch and said second switch are selectively actuated in synchronism with a switching of said changeover switch.

2. A signal line changeover circuit according to claim 1, wherein said third signal processing circuit comprises a color burst level detection circuit for automatic color control of a common signal input thereto from a signal source, said common signal being common to said recording system and said playback system, wherein said first signal processing circuit comprises a circuit for providing a color burst for the playback operation and wherein said second signal processing circuit comprises a circuit for providing a color burst for the recording operation.

3. A signal line changeover circuit according to claim 1, wherein said first and second signal processing circuit, said changeover switch, the first switch, and the second switch are formed with an integrated circuit.

4. A signal line changeover circuit for a video playback/recording device having a recording system and a playback system, said circuit comprising:
- a first circuit for outputting a first signal, said first circuit including an emitter follower for processing said first signal;
- a first signal line connected to an output terminal of the emitter follower of said first circuit;
- a second circuit for outputting a second signal, said second circuit including an emitter follower for processing said second signal;
- a second signal line connected to an output terminal of the emitter follower of said second circuit;
- a common circuit coupled to said first and second circuits, said common circuit operating in response to said signal from said first circuit and in response to said signal from said second circuit; and
- a switch circuit including a changeover switch for selecting one of said first and second signal lines to provide an output signal of said first or second circuit to said common circuit based on a playback/recording operation, said switch circuit also including a switch for providing a voltage for causing an unselected signal line to disable the emitter follower connected thereto through said unselected signal line.

5. A signal line changeover circuit according to claim 4, wherein said first and second circuits and said switch circuit are formed with an integrated circuit.

* * * * *